United States Patent
Kim et al.

(10) Patent No.: US 11,531,843 B2
(45) Date of Patent: Dec. 20, 2022

(54) SUBSTRATE INSPECTION APPARATUS AND METHOD OF DETERMINING FAULT TYPE OF SCREEN PRINTER

(71) Applicants: KOH YOUNG TECHNOLOGY INC., Seoul (KR); KOREA ADVANCED INSTITUTE OF SCIENCE AND TECHNOLOGY, Daejeon (KR)

(72) Inventors: Jong Hwan Kim, Daejeon (KR); Juyoun Park, Busan (KR); Ye Won Hwang, Incheon (KR); Jin Man Park, Daejeon (KR); Seung Jae Lee, Daejeon (KR); Tae Min Choi, Seoul (KR); Yong Ho Yoo, Daejeon (KR); Duk Young Lee, Suwon-si (KR)

(73) Assignees: KOH YOUNG TECHNOLOGY INC., Seoul (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 7 days.

(21) Appl. No.: 16/960,446

(22) PCT Filed: Jan. 21, 2020

(86) PCT No.: PCT/KR2020/001013
§ 371 (c)(1),
(2) Date: Jul. 7, 2020

(87) PCT Pub. No.: WO2020/153712
PCT Pub. Date: Jul. 30, 2020

(65) Prior Publication Data
US 2021/0357693 A1 Nov. 18, 2021

Related U.S. Application Data

(60) Provisional application No. 62/795,311, filed on Jan. 22, 2019.

(51) Int. Cl.
*G06K 9/62* (2022.01)
*G06T 7/00* (2017.01)

(52) U.S. Cl.
CPC .......... *G06K 9/6257* (2013.01); *G06K 9/628* (2013.01); *G06T 7/0004* (2013.01);
(Continued)

(58) Field of Classification Search
CPC ..... G06K 9/6257; G06K 9/628; G06T 7/0004
See application file for complete search history.

(56) References Cited

U.S. PATENT DOCUMENTS 5,751,910 A 5/1998 Bryant et al.
2017/0177997 A1 6/2017 Karlinsky et al.
(Continued)

FOREIGN PATENT DOCUMENTS

JP 2006-216589 8/2006
KR 10-2007-0099994 10/2007
(Continued)

OTHER PUBLICATIONS

Korean Office Action, with English translation, corresponding to Korean Application No. 10-2020-7015760, dated Feb. 25, 2021.
(Continued)

*Primary Examiner* — Sam Bhattacharya
(74) *Attorney, Agent, or Firm* — Kile Park Reed & Houtteman PLLC

(57) ABSTRACT

A substrate inspection apparatus generates, when anomalies of a plurality of second solder pastes among a plurality of first solder pastes printed on a first substrate is detected, at least one image indicating a plurality of second solder pastes with anomalies detected by using an image about a first substrate, applies the at least one image to a machine-learning-based model, acquires a plurality of first values indicating relevance of respective first fault types to the at
(Continued)

least one image and a plurality of first images indicating regions associated with one of a plurality of first fault types, determines a plurality of second fault types, which are associated with the plurality of second solder pastes by using the plurality of first values and the plurality of first images, and determines at least one third solder paste, which is associated with the respective second fault types.

20 Claims, 10 Drawing Sheets

(52) U.S. Cl.
CPC ............... *G06T 2207/30144* (2013.01); *G06T 2207/30164* (2013.01); *G06T 2207/30168* (2013.01); *G06V 2201/06* (2022.01)

(56) References Cited

U.S. PATENT DOCUMENTS

2017/0357895 A1  12/2017  Karlinsky et al.
2017/0364798 A1  12/2017  Karlinsky et al.

FOREIGN PATENT DOCUMENTS

KR  10-2017-0074812  6/2017
KR  10-2018-0133040  12/2018
WO  2016/121628  8/2016

OTHER PUBLICATIONS

Hao Wu et al., "Classification of Solder Joint Using Feature Selection Based on Bayes and Support Vector Machine", IEEE Transactions on Components, Packaging and Manufacturing Technology, Mar. 2013, vol. 3, No. 3, pp. 516-522.

Extended European Search Report, corresponding to European Application No./ Patent No. 20734314.6 dated Jan. 26, 2022.

Yong-Gyu Kim et al., "Defect Classification of SMD Defect Based on Deep Learning", The Korean Institute of Electrical Engineers CICS'17 Conference on Information and Control Systems, Oct. 2017, pp. 15-16.

Csaba Benedek et al., "Solder Paste Scooping Detection by Multilevel Visual Inspection of Printed Circuit Boards", IEEE Transactions on Industrial Electronics, Jun. 2013, pp. 2318-2331, vol. 60, No. 6.

International Search Report, with English translation, for International Application No. PCT/KR2020/001013, dated Apr. 28, 2020.

Written Opinion, with English translation, for International Application No. PCT/KR2020/001013, dated Apr. 28, 2020.

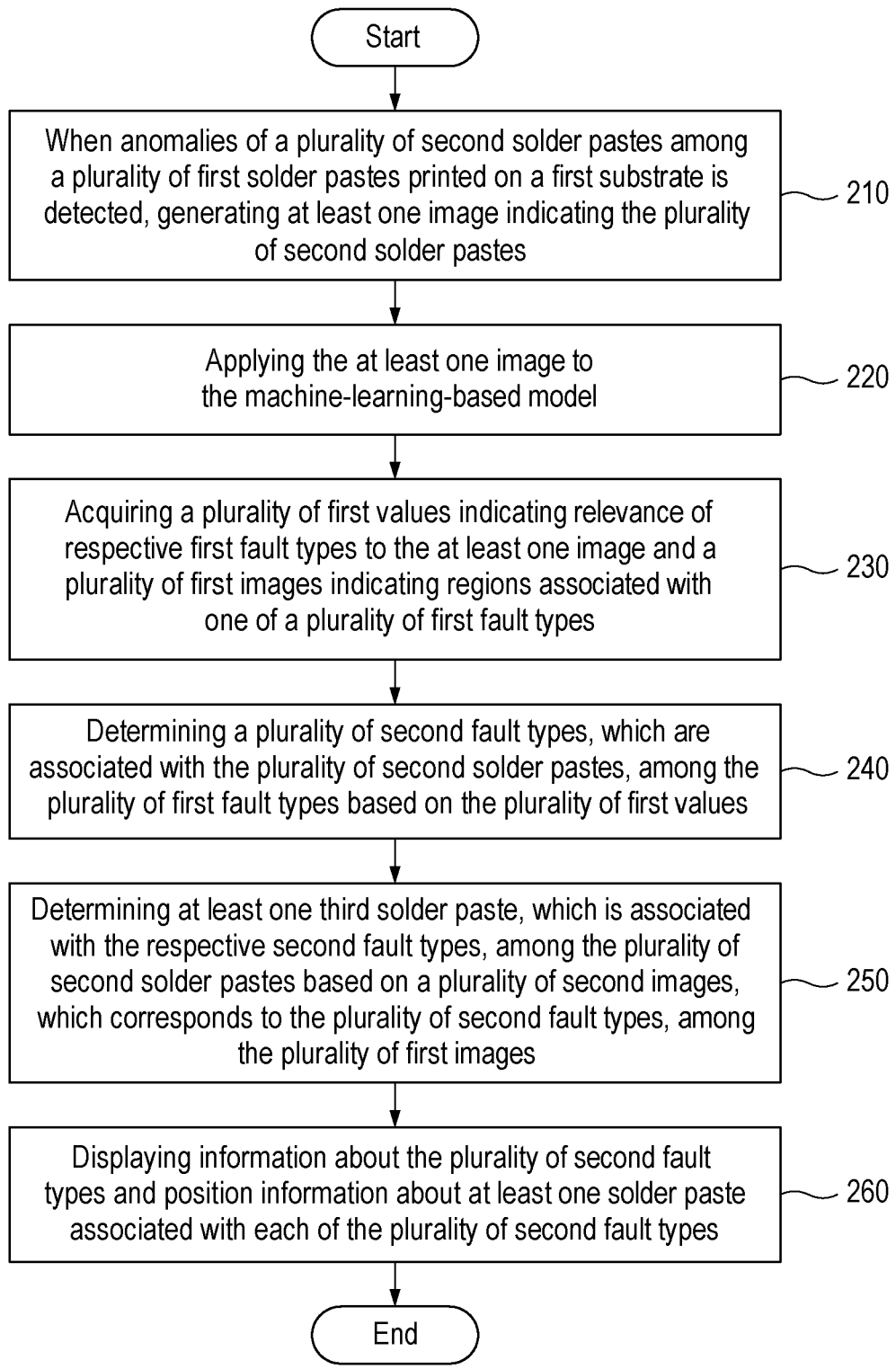

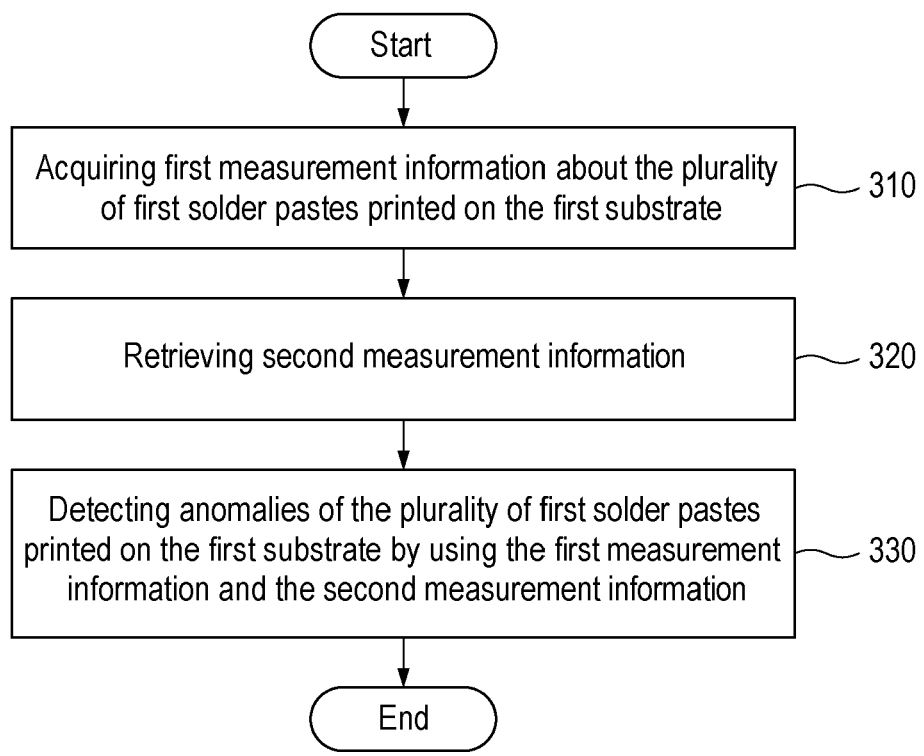

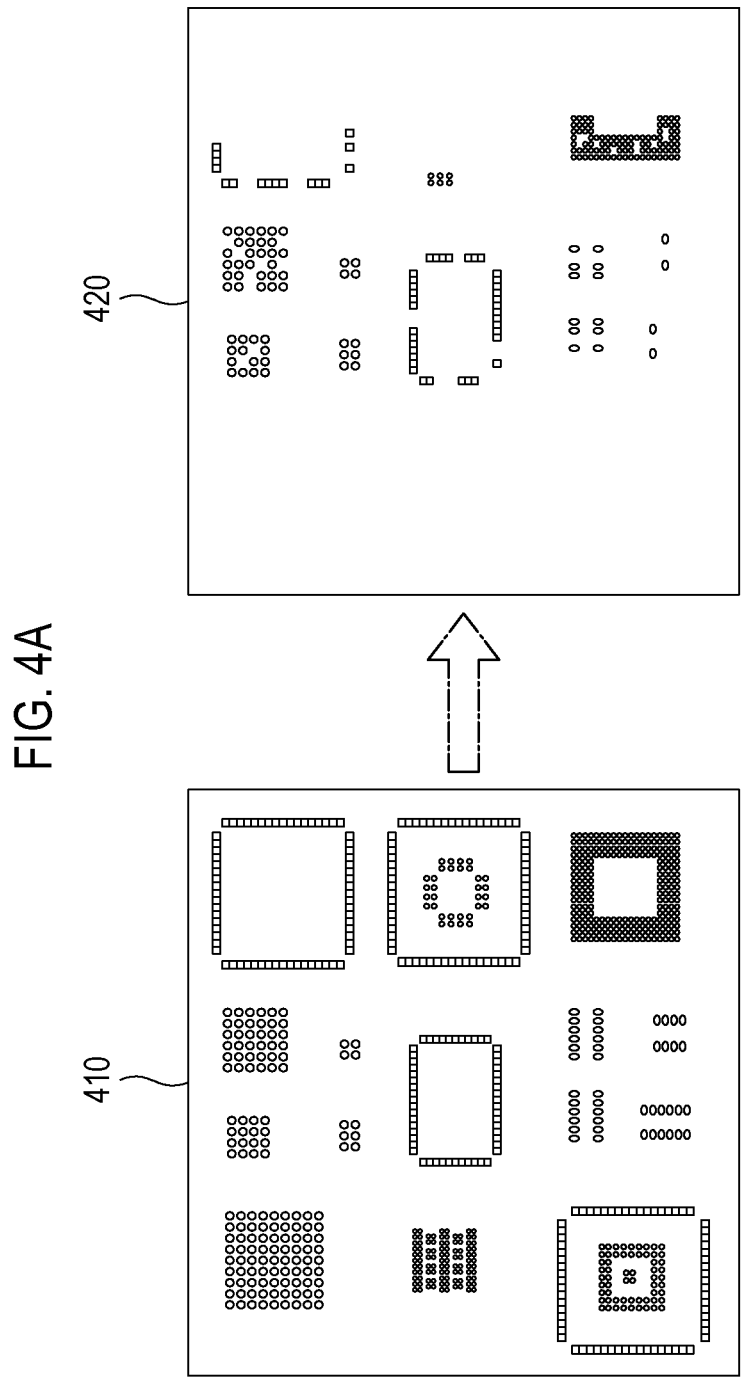

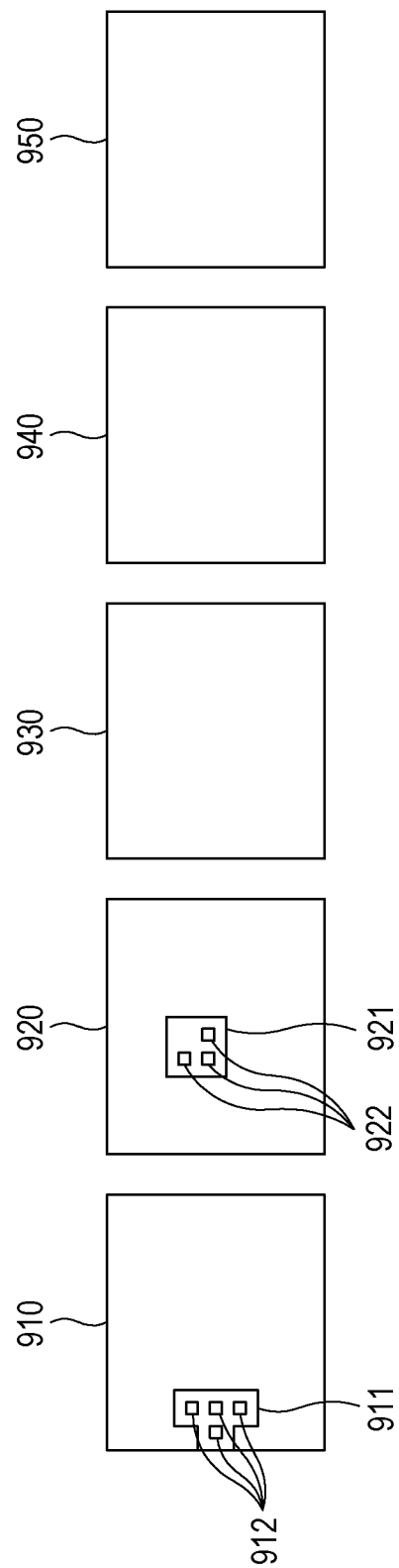

SUBSTRATE INSPECTION APPARATUS AND METHOD OF DETERMINING FAULT TYPE OF SCREEN PRINTER

TECHNICAL FIELD

The present disclosure relates to a substrate inspection apparatus, and more particularly, to a substrate inspection apparatus for determining a fault type of a screen printer used for printing on a substrate.

BACKGROUND

A process of printing a solder paste on a substrate to be mounted on an electronic device is performed by a screen printer. The process of printing the solder paste on the substrate by the screen printer is as follows. The screen printer places the substrate on a table for fixing the substrate and aligns a stencil on the substrate so that the openings of the stencil are located on the corresponding pads of the substrate. Then, the screen printer uses a squeegee to print a solder paste on the substrate through the openings of the stencil. Thereafter, the screen printer separates the stencil from the substrate.

The shape of the solder paste printed on the substrate may be inspected through a solder paste inspection (SPI) technique. The SPI technique is a technique of obtaining a two-dimensional or three-dimensional image of the solder paste printed on the substrate through an optical technique, and inspecting the shape of the solder paste printed on the substrate from the obtained image.

SUMMARY

Various embodiments of the present disclosure provide a substrate inspection apparatus capable of determining a fault type of a screen printer associated with an anomaly of a solder paste and a position on a substrate associated with a fault of the screen printer by using a machine-learning-based model.

Various embodiments of the present disclosure provide a method of determining a fault type of a screen printer associated with an anomaly of a solder paste and a position on a substrate associated with a fault of the screen printer by using a machine-learning-based model in a substrate inspection apparatus.

According to various embodiments of the present disclosure, a substrate inspection apparatus may include: a memory configured to store a machine-learning-based model which has been trained to derive a plurality of values indicating relevance of respective first fault types of a screen printer to an image indicating a plurality of solder pastes with anomalies detected and to generate a plurality of images indicating regions associated with one of the plurality of first fault types by using the image indicating the plurality of solder pastes with anomalies detected; a display; and a processor electrically connected to the memory and the display. The processor may be configured to: when anomalies of a plurality of second solder pastes among a plurality of first solder pastes printed on a first substrate is detected based on an image of the first substrate, generate at least one image indicating the plurality of second solder pastes by using the image about the first substrate; apply the at least one image to the machine-learning-based model; acquire, from the machine-learning-based model, a plurality of first values indicating relevance of the respective first fault types to the at least one image and a plurality of first images indicating regions associated with one of the plurality of first fault types; determine a plurality of second fault types, which are associated with the plurality of second solder pastes, among the plurality of first fault types based on the plurality of first values; and determine at least one third solder paste, which is associated with the respective second fault types, among the plurality of second solder pastes based on a plurality of second images, which correspond to the plurality of second fault types, among the plurality of first images.

In one embodiment, the processor may be configured to detect anomalies of the plurality of second solder pastes among the plurality of first solder pastes by using measurement information about the plurality of first solder pastes acquired by using the image about the first substrate.

In one embodiment, the measurement information may include at least one of a volume, an area, a height, a shape, and a position of a solder paste.

In one embodiment, the plurality of first fault types of the screen printer may include at least one of a fault of a squeeze blade, a squeeze blade fixing fault, a fault of a support, a fault of a table, a fault due to poor grid lock setting, a fault due to neglecting solder paste and poor kneading of solder paste, a fault due to shortage of solder paste, a fault due to poor stencil contact, a fault due to scratches on a stencil, and a fault due to bending of a substrate.

In one embodiment, the machine-learning-based model may be trained to derive the plurality of values indicating the relevance of the respective first fault types to the image indicating the plurality of solder pastes with anomalies detected by using a plurality of images indicating the plurality of solder pastes with anomalies detected classified according to the plurality of first fault types, and to generate the plurality of images indicating the regions associated with one of the plurality of first fault types.

In one embodiment, the processor may be configured to acquire, from the machine-learning-based model, threshold value information indicating threshold values of the respective first fault types, and to determine the plurality of second fault types, which are associated with the plurality of second solder pastes, by comparing the plurality of first values with the threshold values of the respective first fault types determined by using the threshold value information.

In one embodiment, the machine-learning-based model may be configured to learn the threshold value information by adjusting the threshold value set for the respective first fault types through the plurality of values indicating the relevance of the respective first fault types to the image indicating the plurality of solder pastes with anomalies detected.

In one embodiment, the regions indicated by the respective images generated by the machine-learning-based model may be regions associated with different fault types.

In one embodiment, the processor may be configured to determine regions associated with the plurality of second fault types based on the plurality of second images, and to determine the at least one third solder paste, which is associated with the respective second fault types, based on the regions associated with the plurality of second fault types and positions of the respective second solder pastes determined by using the image about the first substrate.

In one embodiment, the processor may be configured to, after determining the plurality of second fault types, train the machine-learning-based model by using the at least one image.

According to various embodiments of the present disclosure, a method of determining a fault type of a screen printer by a substrate inspection apparatus may include: when anomalies of a plurality of second solder pastes among a plurality of first solder pastes printed on a first substrate is detected based on an image about the first substrate, generating at least one image indicating the plurality of second solder pastes by using the image about the first substrate; applying the at least one image to a machine-learning-based model; acquiring, from the machine-learning-based model, a plurality of first values indicating relevance of respective first fault types to the at least one image and a plurality of first images indicating regions associated with one of a plurality of first fault types; determining a plurality of second fault types, which are associated with the plurality of second solder pastes, among the plurality of first fault types based on the plurality of first values; and determining at least one third solder paste, which is associated with the respective second fault types among the plurality of second solder pastes based on a plurality of second images, which correspond to the plurality of second fault types, among the plurality of first images. The machine-learning-based model may be trained to derive a plurality of values indicating relevance of the respective first fault types of the screen printer to an image indicating a plurality of solder pastes with anomalies detected, and to generate a plurality of images indicating regions associated with one of the plurality of first fault types by using the image indicating the plurality of solder pastes with anomalies detected.

In one embodiment, the method may further include: detecting anomalies of the plurality of second solder pastes among the plurality of first solder pastes by using measurement information about the plurality of first solder pastes acquired by using the image about the first substrate.

In one embodiment, the measurement information may include at least one of a volume, an area, a height, a shape, and a position of a solder paste.

In one embodiment, the plurality of first fault types of the screen printer may include at least one of a fault of a squeeze blade, a squeeze blade fixing fault, a fault of a support, a fault of a table, a fault due to poor grid lock setting, a fault due to neglecting solder paste alone and poor kneading of solder paste, a fault due to shortage of solder paste, a fault due to poor stencil contact, a fault due to scratches on a stencil, and a fault due to bending of a substrate.

In one embodiment, the machine-learning-based model may be trained to derive the plurality of values indicating the relevance of the respective first fault types to the image indicating the plurality of solder pastes with anomalies detected by using a plurality of images indicating the plurality of solder pastes with anomalies detected classified according to the plurality of first fault types, and to generate the plurality of images indicating the regions associated with one of the plurality of first fault types.

In one embodiment, the step of determining the plurality of second fault may comprise: acquiring, from the machine-learning-based model, threshold value information indicating threshold values of the respective first fault types; and determining the plurality of second fault types, which are associated with the plurality of second solder pastes by comparing the plurality of first values with the threshold values of the respective first fault types determined by using the threshold value information.

In one embodiment, the machine-learning-based model may learn the threshold value information by adjusting the threshold values set for the respective first fault types by using the plurality of values indicating the relevance of the respective first fault types to the image indicating the plurality of solder pastes with anomalies detected.

In one embodiment, the regions indicated by the respective images generated by the machine-learning-based model may be regions associated with different fault types.

In one embodiment, the step of determining at least one third solder paste may comprise: determining regions associated with the plurality of second fault types based on the plurality of second images; and determining the at least one third solder paste, which is associated with the respective second fault types, based on the regions associated with the plurality of second fault types and positions of the respective second solder pastes determined by using the image about the first substrate.

In one embodiment, the method may further include: after determining the plurality of second fault types, training the machine-learning-based model by using the at least one image.

The substrate inspection apparatus according to various embodiments of the present disclosure may determine a fault type of a screen printer associated with a plurality of solder pastes with anomalies detected from at least one fault type of the screen printer by using at least one image indicating the plurality of solder pastes with anomalies detected among a plurality of solder pastes printed on a substrate. In addition, the substrate inspection apparatus may determine a position on the substrate associated with the fault of the screen printer. This makes it possible to quickly identify and correct the fault type of the screen printer incurring the anomaly of the solder pastes and the position on the substrate associated with the fault of the screen printer.

BRIEF DESCRIPTION OF DRAWINGS

FIG. 2 is a flowchart of a method of determining a fault type of a screen printer associated with solder pastes with anomalies detected and a position on a substrate associated with a fault of the screen printer according to various embodiments of the present disclosure.

FIG. 3 is a flowchart of a method of detecting an anomaly of a plurality of solder pastes printed on a substrate according to various embodiments of the present disclosure.

FIGS. 4A and 4B show images indicating a plurality of second solder pastes with anomalies detected according to various embodiments of the present disclosure.

FIG. 9 shows a plurality of images generated in a machine-learning-based model according to various embodiments of the present disclosure.

DETAILED DESCRIPTION

Figure 1:
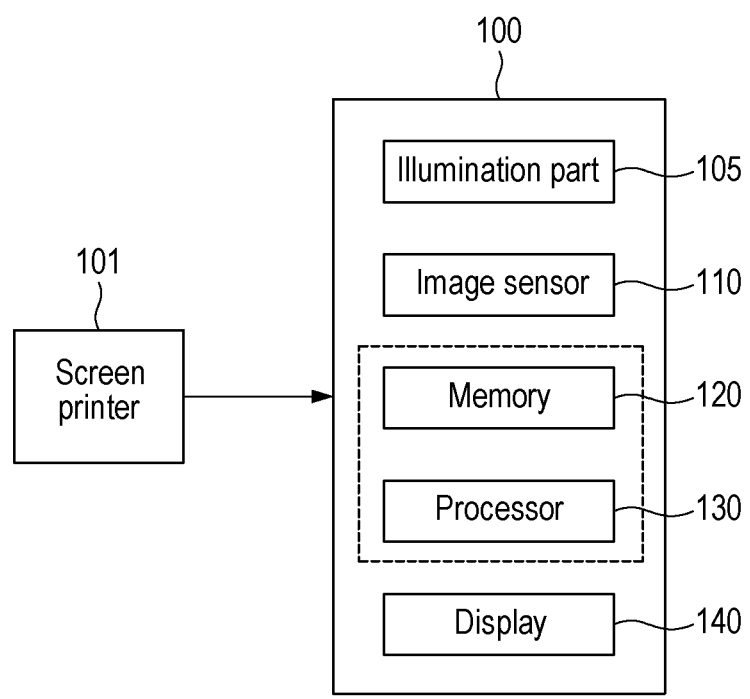
FIG. 1 is a block diagram of a substrate inspection apparatus according to various embodiments of the present disclosure.

Embodiments of the present disclosure are illustrated for describing the technical spirit of the present disclosure. The scope of the claims according to the present disclosure is not limited to the embodiments described below or to the detailed descriptions of these embodiments.

All technical or scientific terms used herein have meanings that are generally understood by a person having ordinary knowledge in the art to which the present disclosure pertains, unless otherwise specified. The terms used herein are selected for only more clear illustration of the present disclosure, and are not intended to limit the scope of claims in accordance with the present disclosure.

The expressions "include", "provided with", "have" and the like used herein should be understood as open-ended terms connoting the possibility of inclusion of other embodiments, unless otherwise mentioned in a phrase or sentence including the expressions.

A singular expression can include meanings of plurality, unless otherwise mentioned, and the same applies to a singular expression stated in the claims.

The terms "first", "second", etc. used herein are used to identify a plurality of components from one another, and are not intended to limit the order or importance of the relevant components.

The expression "based on" used herein is used to describe one or more factors that influences a decision, an action of judgment or an operation described in a phrase or sentence including the relevant expression, and this expression does not exclude additional factors influencing the decision, the action of judgment or the operation.

When a certain component is described as "coupled to" or "connected to" another component, this should be understood as meaning that the certain component may be coupled or connected directly to the other component or that the certain component may be coupled or connected to the other component via a new intervening component.

Hereinafter, embodiments of the present disclosure will be described with reference to the accompanying drawings. In the accompanying drawings, like or relevant components are indicated by like reference numerals. In the following description of embodiments, repeated descriptions of the identical or relevant components will be omitted. However, even if a description of a component is omitted, such a component is not intended to be excluded in an embodiment.

Although process steps, method steps, algorithms, etc. are illustrated in a sequential order in the flowchart shown in the present disclosure, such processes, methods, and algorithms may be configured to be operated in any suitable order. In other words, the steps in the processes, methods, and algorithms explained in various embodiments of the present disclosure are not necessarily performed in the order described in the present disclosure. Further, even though some steps are explained as being performed non-simultaneously, such steps may be simultaneously performed in another embodiment. Moreover, the illustration of the processes depicted in the figure does not mean that the illustrated processes exclude other changes and modifications thereto, that any of the illustrated processes or the steps thereof is essential for at least one of various embodiments of the present disclosure, and that the illustrated processes are desirable.

FIG. 1 is a block diagram of a substrate inspection apparatus according to various embodiments of the present disclosure.

According to various embodiments of the present disclosure, a substrate inspection apparatus 100 may include an illumination part 105, an image sensor 110, a memory 120, and a processor 130. The substrate inspection apparatus 100 may further include a display 140 for outputting a result processed by the processor 130, another output device (not shown), or a communication circuit (not shown) for transmitting the processed result to another electronic device. The illumination part 105, the image sensor 110, the memory 120, the processor 130, and the display 140 may be electrically connected to each other to transmit and receive signals.

The illumination part 105 may include one or more illumination parts and may emit pattern light on a substrate moved to a preset position for inspecting a mounting state of a component. For example, the pattern light may be light having a pattern of constant periods, which is emitted to measure a three-dimensional shape for the substrate. The illumination part 105 may emit pattern light in which the brightness of a stripe is sinusoidal, on-off-type pattern light in which bright portions and dark portions are repeatedly present, triangular wave pattern light in which a change in brightness is a triangular waveform, or the like. However, this is only for the purpose of explanation. The present disclosure is not limited thereto. The illumination part 105 may emit light including various types of patterns in which a change in brightness is repeated at a constant cycle.

In addition, the illumination part 105 may emit first wavelength light, second wavelength light, and third wavelength light on the substrate. For example, the illumination part 105 may sequentially emit the first wavelength light, the second wavelength light, and the third wavelength light, or may simultaneously emit at least two of the first wavelength light, the second wavelength light, and the third wavelength light.

In one embodiment, the image sensor 110 may receive at least one of the pattern light, the first wavelength light, the second wavelength light, and the third wavelength light, which are vertically reflected from the substrate and components mounted on the substrate. The image sensor 110 may generate an image and a three-dimensional shape of the substrate by using at least one of the pattern light, the first wavelength light, the second wavelength light, and the third wavelength light, which have been received.

As such, the image sensor 110 may acquire an image about the substrate on which a plurality of solder pastes is printed by a screen printer 101. The image obtained by the image sensor 110 may be a two-dimensional or three-dimensional image about the substrate. For example, the image sensor 110 may include at least one charge coupled device (CCD) camera, a complementary metal oxide semiconductor (CMOS) camera, and the like. However, this is only for the purpose of explanation. The present disclosure is not limited thereto. Various image sensors may be used as the image sensor 110.

In one embodiment, the image about the substrate obtained by the image sensor 110 may be used to measure information about the plurality of solder pastes printed on the substrate. For example, the processor 130 may measure information including at least one of volumes, areas, heights, shapes, and positions of the plurality of solder pastes printed on the substrate by using the image about the substrate. However, this is only for the purpose of explanation. The present disclosure is not limited thereto. Various kinds of information capable of indicating the characteristics of the plurality of solder pastes may be measured based on the image about the substrate. Hereinafter, "measurement information" may be defined as information about a plurality of solder pastes, which are specified based on an image about a substrate.

In one embodiment, the memory 120 may store instructions or data associated with at least one other component of the substrate inspection apparatus 100. Furthermore, the memory 120 may store software and/or a program. For example, the memory 120 may include an internal memory or an external memory. The internal memory may include at least one of a volatile memory (e.g., a DRAM, an SRAM, or an SDRAM), and a nonvolatile memory (e.g., a flash memory, a hard disk drive, or a solid state drive (SSD)). The external memory may be functionally or physically connected to the substrate inspection apparatus 100 through various interfaces.

In one embodiment, the memory 120 may store instructions for operating the processor 130. For example, the memory 120 may store instructions for causing the processor 130 to control other components of the substrate inspection apparatus 100 and to interoperate with an external electronic device or a server. Based on the instructions stored in the memory 120, the processor 130 may control other components of the substrate inspection apparatus 100 and may interoperate with the external electronic device or the server. Hereinafter, the operation of the substrate inspection apparatus 100 will be described mainly based on the respective components of the substrate inspection apparatus 100. In addition, instructions for causing each component to perform an operation may be stored in the memory 120.

In one embodiment, the memory 120 may store a machine-learning-based model. The machine-learning-based model may derive a plurality of values that indicates relevance between each of a plurality of first fault types of the screen printer 101 and an image indicating a plurality of solder pastes with anomalies detected. For example, if the number of the first fault types is five, the machine-learning-based model may derive five values that indicate relevance between each of the first fault types and an image indicating the plurality of solder pastes with anomalies detected.

In one embodiment, the plurality of values that indicates the relevance between the plurality of first fault types and the image indicating the anomaly of the plurality of solder pastes printed on the substrate may be probability values. For example, based on the plurality of values derived from the machine-learning-based model, it may be determined that the relevance of the image indicating the plurality of solder pastes with anomalies detected to a first fault type of the screen printer 101 is a %, and the relevance of the image indicating the plurality of solder pastes with anomalies detected to a second fault type of the screen printer 101 is b %. However, this is only for the purpose of explanation. The present disclosure is not limited thereto. Various values capable of indicating relevance may be used. As such, the plurality of values derived from the machine-learning-based model may be used to determine a plurality of second fault types associated with the plurality of solder pastes with anomalies detected, among the plurality of first fault types of the screen printer 101.

In addition, the machine-learning-based model may be trained to generate a plurality of images indicating a region associated with one of the plurality of first fault types by using the images indicating the plurality of solder pastes with anomalies detected. For example, if the number of the plurality of first fault types is five, the machine-learning-based model may generate five images indicating regions, which are associated with the plurality of first fault types, respectively. As such, the regions indicated by the plurality of images generated in the machine-learning-based model may be regions associated with different fault types among the plurality of first fault types. For example, a region indicated by an A image among the plurality of images may be a region associated with an A fault type among the plurality of first fault types, and a region indicated by a B image may be a region associated with a B fault type among the plurality of first fault types. The plurality of images generated in the machine-learning-based model may be used to determine a position on the substrate, which is associated with the faults of the screen printer 101.

In one embodiment, the machine-learning-based model may include a convolutional neural network (CNN) and a feed forward neural network (FFNN). Furthermore, the machine-learning-based model may be stored in a memory of an electronic device (e.g., an external server, etc.) that is connected with the substrate inspection apparatus 100 in a wired or wireless manner. In this case, the substrate inspection apparatus 100 may transmit and receive information for determining a fault type associated with at least one solder paste with anomalies detected and a position on a substrate associated with a fault of the screen printer 101, to and from the electronic device that is connected with the substrate inspection apparatus 100 in a wired or wireless manner.

In one embodiment, the plurality of first fault types of the screen printer 101 may be fault types capable of incurring an anomaly in the solder pastes printed on the substrate among various fault types that may occur in the screen printer 101. For example, the plurality of first fault types of the screen printer 101 may include at least one of a fault of a squeeze blade of the screen printer 101, a fault of fixing the squeeze blade (e.g., a fixing fault of a screw for fixing a squeeze blade, etc.), a fault of a support of the screen printer 101, a fault of a table for the screen printer 101, a fault due to poor grid lock setting when using a grid lock as a support, a fault due to the state of the solder paste supplied from the screen printer 101, for example, neglecting solder paste or poor kneading of the solder paste, a fault due to shortage of the solder paste supplied from the screen printer 101, a fault due to a poor contact of a stencil, a fault due to a scratch on the stencil of the screen printer 101, and a fault due to bending of the substrate provided to the screen printer 101. However, these are only for the purpose of explanation. The present disclosure is not limited thereto. Various fault types of the screen printer 101 capable of incurring an anomaly in the solder pastes printed on the substrate may be included in the plurality of first fault types of the screen printer 101.

In one embodiment, the processor 130 may drive an operating system or an application program to control at least one component of the substrate inspection apparatus 100 and to perform various data processing procedures and calculations. For example, the processor 130 may include a central processing unit and the like, or may be implemented as a system-on-chip (SoC).

In one embodiment, the display 140 may include, for example, a liquid crystal display (LCD), a light emitting diode (LED) display, an organic light emitting diode (OLED) display, and the like. The display 340 may display, for example, various types of contents (e.g., texts, images, videos, icons, and/or symbols) to a user. The display 340 may include a touch screen. For example, the display 340 may receive a touch, a gesture, a proximity or a hovering input performed using an electronic pen or a part of a user's body.

In one embodiment, the processor 130 may acquire an image about a first substrate through the image sensor 110. The processor 130 may detect occurrence or non-occurrence of an anomaly in a plurality of first solder pastes printed on the first substrate, based on the image about the first substrate. A detailed method of detecting occurrence or non-occurrence of an anomaly in the plurality of first solder pastes by the processor 130 will be described later.

When an anomaly is detected in a plurality of second solder pastes among the plurality of first solder pastes, the processor 130 may generate at least one image indicating the plurality of second solder pastes with anomalies detected by using the image about the first substrate. The at least one image generated by the processor 130 may be an image having the same format as the image used for teaching the machine-learning-based model. In other words, the machine-learning-based model may also perform learning by using an image in which a solder paste with anomalies detected is distinguished from a solder paste with no anomalies detected. A detailed learning process of the machine-learning-based model by using such an image will be described later.

In one embodiment, in the at least one image generated by the processor 130, a plurality of second solder pastes with anomalies detected may be distinguished from a plurality of third solder pastes with no anomalies detected among the plurality of first solder pastes. For example, in the at least one image, the plurality of second solder pastes and the plurality of third solder pastes may be indicated in different colors, or only the plurality of second solder pastes may be indicated without indicating the plurality of third solder pastes. However, this is only for the purpose of explanation. The present disclosure is not limited thereto. In the process of generating such at least one image, various methods for distinguishing the plurality of second solder pastes from the plurality of third solder pastes may be used.

Furthermore, in the at least one image, the plurality of second solder pastes may be divided into a plurality of fourth solder pastes with an excessive-solder anomaly and a plurality of fifth solder pastes with an insufficient-solder anomaly. For example, the plurality of fourth solder pastes and the plurality of fifth solder pastes may be indicated separately in one image. An image indicating only the plurality of fourth solder pastes and an image indicating only the plurality of fifth solder pastes may be generated separately.

In one embodiment, the processor 130 may apply the at least one image to the machine-learning-based model. The machine-learning-based model may derive a plurality of first values that indicates relevance of the respective first fault types to the at least one image by using the at least one image, and may generate a plurality of first images indicating regions associated with one of the plurality of first fault types. The processor 130 may obtain a plurality of first values and a plurality of first images from the machine-learning-based model.

In one embodiment, the processor 130 may determine a plurality of second fault types, which are associated with the plurality of second solder pastes with anomalies detected, among the plurality of first fault types based on the plurality of first values obtained from the machine-learning-based model. For example, the processor 130 may determine a plurality of second fault types by comparing the plurality of first values with preset threshold values for the respective first fault types. As another example, the processor 130 may determine a plurality of second fault types by obtaining threshold value information indicating respective threshold values of the plurality of first fault types from the machine-learning-based model, and comparing the plurality of first values with the respective threshold values of the plurality of first fault types identified by the obtained threshold value information. A detailed method of determining the plurality of second fault types will be described later.

In one embodiment, the processor 130 may determine a plurality of second images, which correspond to the plurality of second fault types, among the plurality of first images obtained from the machine-learning-based model. As described above, the plurality of first images generated by the machine-learning-based model indicates regions associated with the respective first fault types. Therefore, the processor 130 may determine a plurality of second images, which corresponds to the plurality of second fault types, among the plurality of first images. The processor 130 may determine at least one solder paste, which is associated with each of the plurality of second fault types, among the plurality of second solder pastes with anomalies detected, based on the plurality of second images. For example, if the plurality of second fault types is an A fault type and a B fault type, the processor 130 may determine, among the plurality of second solder pastes, at least one solder paste associated with the A fault type and at least one solder paste associated with the B fault type.

The processor 130 may display information about the plurality of second fault types and position information about at least one solder paste associated with each of the plurality of second fault types on the display 140. This allows a user to confirm the fault type of the screen printer on which the anomaly of the plurality of second solder pastes is based, and also to easily identify the fault type of the screen printer with which each of the plurality of second solder pastes is associated.

In one embodiment, the processor 130 may determine the fault type of the screen printer 101 associated with the plurality of second solder pastes with anomalies detected, and then may cause the machine-learning-based model to perform learning by using the at least one image generated by the processor 130. As such, the processor 130 may cause the machine-learning-based model to perform learning each time when the substrate is inspected. This makes it possible to more accurately determine the fault type of the screen printer 101 associated with the solder paste with anomalies detected.

In one embodiment, the substrate inspection apparatus 100 may include only the memory 120 and the processor 130, in which case, the substrate inspection apparatus 100 may receive an image about the first substrate from an external electronic device for the fault type determination and the like.

FIG. 2 is a flowchart of a method of determining the fault type of the screen printer associated with the solder paste with anomalies detected and a position on the substrate associated with the fault of the screen printer according to various embodiments of the present disclosure.

In step 210, when anomalies of a plurality of second solder pastes among a plurality of first solder pastes printed on a first substrate is detected based on an image about the first substrate, the processor 130 of the substrate inspection apparatus 100 may generate at least one image indicating the plurality of second solder pastes by using the image about the first substrate. For example, the processor 130 may acquire an image about the first substrate through the image sensor 110, and may further acquire measurement information about the plurality of first solder pastes by using the acquired image. The processor 130 may inspect occurrence or non-occurrence of an anomaly with respect to each of the plurality of first solder pastes by using the acquired measurement information.

The processor 130 may generate at least one image indicating the plurality of second solder pastes with anomalies detected based on the image about the first substrate. The at least one image generated by the processor 130 may be an image distinguished from an image about the first substrate in which the plurality of first solder pastes printed on the first substrate are indicated without distinction, and may be an image in which a plurality of second solder pastes with anomalies detected is distinguished from a plurality of third solder pastes with no anomalies detected among the plurality of first solder pastes. In addition, the at least one image may be an image having the same format as the image used for teaching the machine-learning-based model. In other words, the machine-learning-based model may also learn through an image in which a solder paste with anomalies detected is distinguished from a solder paste with no anomalies detected.

In step 220, the processor 130 may apply the at least one image generated in step 210 to the machine-learning-based model stored in the memory 120. The machine-learning-based model may derive a plurality of first values which indicates relevance of the respective first fault types to the at least one image by using the at least one image, and may generate a plurality of first images indicating regions associated with one of the plurality of first fault types.

In step 230, the processor 130 may acquire, from the machine-learning-based model, the plurality of first values which indicates relevance of the respective first fault types to the at least one image and the plurality of first images indicating the regions associated with one of the plurality of first fault types. For example, the number of the plurality of first values and the number of the plurality of first images may be equal to the number of the plurality of first fault types. Furthermore, the regions indicated by each of the plurality of first images generated by the machine-learning-based model may be regions associated with different fault types among the plurality of first fault types.

In step 240, the processor 130 may determine a plurality of second fault types, which are associated with the plurality of second solder pastes with anomalies detected, among the plurality of first fault types based on the plurality of first values obtained from the machine-learning-based model. For example, the processor 130 may determine a plurality of second fault types by comparing the threshold values of each of the plurality of first fault types, identified by the threshold information obtained from the machine-learning-based model or from the threshold values set for each of the plurality of first fault types, with the plurality of first values.

In step 250, the processor 130 may determine at least one solder paste, which is associated with each of the plurality of second fault types, among the plurality of second solder pastes based on the plurality of second images, which corresponds to the plurality of second fault types, among the plurality of first images obtained from the machine-learning-based model. For example, the processor 130 may determine a plurality of second images, which corresponds to the plurality of second fault types, among the plurality of first images, and may determine at least one solder paste associated with the respective second fault types based on the regions indicated by the plurality of second images.

In step 260, the processor 130 may display information about the plurality of second fault types and position information about at least one solder paste associated with each of the plurality of second fault types on the display 140. This allows a user to confirm the fault type of the screen printer on which the anomaly of the plurality of second solder pastes is based, and also to easily identify the fault type of the screen printer with which each of the plurality of second solder pastes is associated.

FIG. 3 is a flowchart of a method of detecting anomalies of the plurality of solder pastes printed on the substrate according to various embodiments of the present disclosure.

In step 310, the processor 130 of the substrate inspection apparatus 100 may acquire first measurement information about the plurality of first solder pastes printed on the first substrate by using the image about the first substrate obtained through the image sensor 110. For example, the processor 130 may measure information about at least one of a volume, an area, a height, a shape, and a position of each of the plurality of solder pastes from an image, and may generate first measurement information based on the measured information.

In step 320, the processor 130 may retrieve second measurement information from the memory 120. As another example, the processor 130 may receive the second measurement information from an external server. The second measurement information may be measurement information about a plurality of solder pastes printed on each of a plurality of second substrates which has been inspected by the substrate inspection apparatus 100 prior to the inspection of the first substrate. For example, during the inspection of each of the plurality of second substrates, the processor 130 may measure information about at least one of a volume, an area, a height, a shape and a position of the plurality of solder pastes printed on each of the plurality of second substrates from an image of each of the plurality of second substrates, and may generate second measurement information based on the measured information. The processor 130 may store the generated second measurement information in the memory 120 or in an external server. In addition, after the first substrate is inspected, the processor 130 may update the second measurement information by adding the first measurement information to the second measurement information.

In step 330, the processor 130 may detect anomalies of the plurality of first solder pastes printed on the first substrate by using the first measurement information and the second measurement information. For example, the processor 130 may determine a difference between the first measurement information and the second measurement information by comparing the first measurement information and the second measurement information. If a portion in the determined difference falls outside a preset range, the processor 130 may determine that anomalies are present in the plurality of second solder pastes, which corresponds to the portion falling outside the preset range, among the plurality of first solder pastes printed on the first substrate. In addition, the processor 130 may determine a difference between the first measurement information and the second measurement information; and if the determined difference does not fall outside the preset range, the processor 130 may determine that no anomaly is present in the plurality of first solder pastes printed on the first substrate.

In addition to the above-described method, the processor 130 may compare the measurement information about the plurality of first solder pastes with a reference value which is set to detect an anomaly of each of the plurality of first solder pastes. Depending on the comparison result, the processor 130 may determine occurrence or non-occurrence of anomalies in the plurality of first solder pastes. For example, a solder paste, which has measurement information exceeding the reference value, among the plurality of first solder pastes may be determined to have an anomaly; and a solder paste, which has measurement information less than the reference value, among the plurality of first solder pastes may be determined to have no anomaly. However, this is only for the purpose of explanation. The present disclosure is not limited thereto. The processor 130 may inspect occurrence or non-occurrence of anomalies in the plurality of first solder pastes in various ways in consideration of the characteristics of the plurality of first solder pastes by using the measurement information about the plurality of first solder pastes.

Figure 4B:
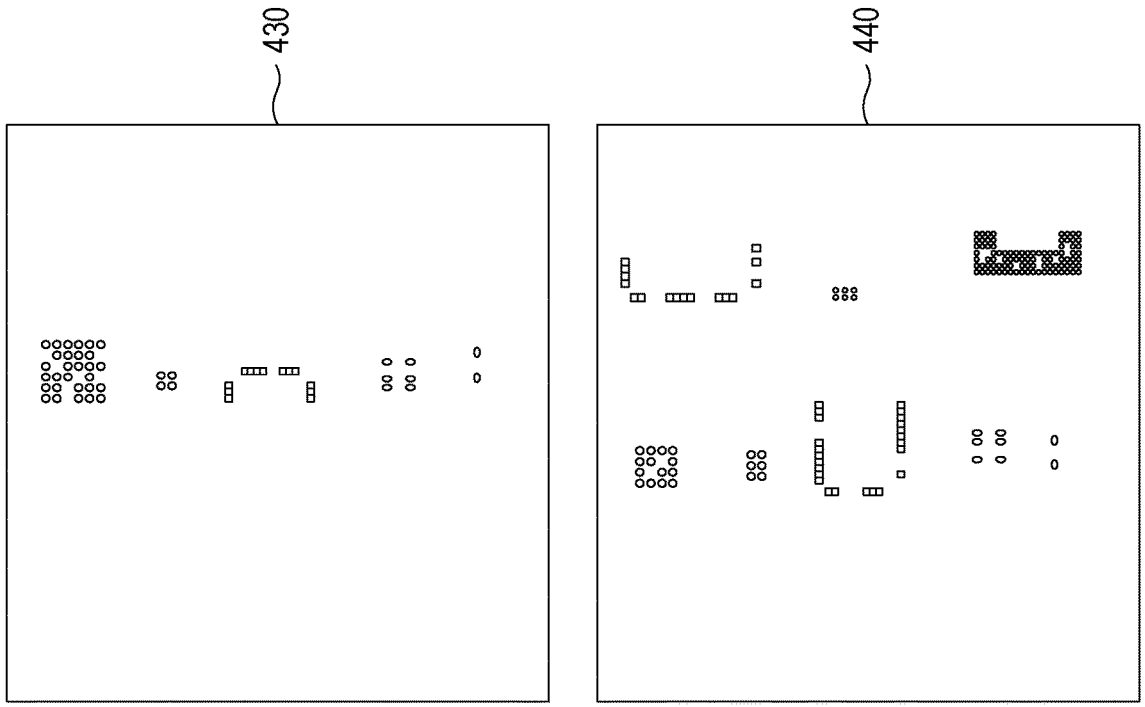

FIGS. 4A and 4B show images indicating a plurality of second solder pastes with anomalies detected according to various embodiments of the present disclosure.

In one embodiment, the processor 130 of the substrate inspection apparatus 100 may generate at least one image 420, 430, or 440 indicating a plurality of second solder pastes with anomalies detected by using an image 410 of the first substrate. The processor 230 may apply the at least one image 420, 430, or 440 to the machine-learning-based model. The machine-learning-based model may generate a plurality of first values indicating relevance of the respective first fault types to the at least one image 420, 430, or 440 and a plurality of first images indicating regions associated with one of the plurality of first fault types by using the at least one image 420, 430, or 440.

In addition, the at least one image 420, 430, or 440 may be an image having the same format as the image used for teaching the machine-learning-based model. In other words, the machine-learning-based model may also learn by using an image in which a solder paste with anomalies detected is distinguished from a solder paste with no anomalies detected.

In the at least one image 420, 430, or 440 generated by the processor 130, a plurality of second solder pastes with anomalies detected may be distinguished from a plurality of third solder pastes with no anomalies detected among the plurality of first solder pastes. Referring to FIGS. 4A and 4B, as in the at least one image 420, 430, or 440, only a plurality of second solder pastes may be displayed, and a plurality of third solder pastes may not be displayed. That is, the processor 130 may generate the at least one image 420, 430, or 440 in which the plurality of second solder pastes is indicated in white and the plurality of third solder pastes is indicated in black. In addition, the processor 130 may generate the at least one image 420, 430, or 440 by setting a pixel value for the plurality of second solder pastes to 1 and setting a pixel value for the plurality of third solder pastes to 0. The colors for the pixel values may be differently set. As such, by generating the at least one image 420, 430, or 440, the plurality of second solder pastes and the plurality of third solder pastes may be clearly distinguished from each other.

In one embodiment, as in FIG. 4A, the processor 130 may generate the image 420 indicating all of the plurality of second solder pastes with anomalies detected. Alternatively, as in FIG. 4B, the processor 130 may generate the image 430 indicating only a plurality of fourth solder pastes with an excessive-solder anomaly and an image 440 indicating only a plurality of fifth solder pastes with an insufficient-solder anomaly. The processor 130 may generate the at least one image 420, 430, or 440 in the same format as the image by which the machine-learning-based model learns.

In addition, when the teaching of the machine-learning-based model is performed based on at least one image different from the above-described images, the processor 130 may generate at least one image different from the above-described images.

Figure 5:
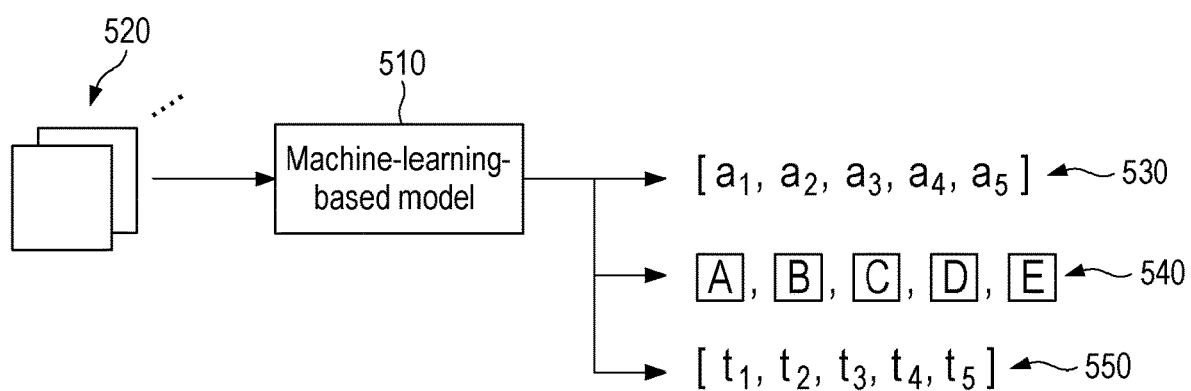
FIG. 5 is a view for explaining a learning method of a machine-learning-based model according to various embodiments of the present disclosure.

FIG. 5 is a view for explaining a learning method of a machine-learning-based model according to various embodiments of the present disclosure.

In an embodiment, the processor 130 of the substrate inspection apparatus 100 may cause the machine-learning-based model stored in the memory 120 to perform learning by using a plurality of images indicating a plurality of solder pastes with anomalies detected classified according to a plurality of first fault types. However, this is only for the purpose of explanation. The present disclosure is not limited thereto. The teaching of the machine-learning-based model may be performed by another processor included in the substrate inspection apparatus 100 or a processor of another external electronic device, besides the processor 130.

Referring to FIG. 5, the teaching of the machine-learning-based model 510 may be performed by using a plurality of images 520 indicating a plurality of solder pastes with anomalies detected classified according to a plurality of first fault types. For example, the images used for teaching the machine-learning-based model 510 may be the images described with reference to FIGS. 4A and 4B. Hereinafter, for the sake of convenience of explanation, the description will be made mainly on a case where the plurality of images 520 used for teaching the machine-learning-based model 510 are images indicating all the solder pastes with anomalies detected (e.g., the image 420 of FIG. 4A). However, the present disclosure is not limited thereto.

The plurality of images 520 used for teaching the machine-learning-based model 510 may be classified according to the plurality of first fault types. However, the plurality of images 520 may not necessarily be classified into one first fault type, but may be classified into a plurality of first fault types. For example, an A image of the plurality of images 520 may be associated with each of an A fault type and a B fault type, in which case the A image may be classified as being associated with the A fault type and the B fault type.

The teaching of the machine-learning-based model 510 may be performed such that, when the plurality of images 520 classified according to the plurality of first fault types is inputted, the machine-learning-based model 510 derives a plurality of values 530 indicating a relevance of the respective first fault types to the plurality of images 520 by using the plurality of inputted images 520, and generates a plurality of images 540 indicating regions associated with one of the plurality of first fault types.

For example, when the plurality of images 520 is inputted, the machine-learning-based model 510 may determine information (e.g., a position, a shape, a volume, etc.) of the plurality of solder pastes by using the plurality of inputted images 520. Based on the information determined by using the plurality of images 520, the machine-learning-based model 510 may adjust parameters for deriving a plurality of values 530 indicating relevance of the respective first fault types to the plurality of images 520. In addition, based on the determined information, the machine-learning-based model 510 may adjust parameters for generating a plurality of images 540 indicating regions associated with one of the plurality of first fault types.

Through such a process, the teaching of the machine-learning-based model 510 may be performed to derive a plurality of values 530 indicating relevance of the respective first fault types to a plurality of images 520, and to generate a plurality of images 540 indicating regions associated with the respective first fault types.

In addition, the teaching of the machine-learning-based model 510 may be performed to derive threshold value information 550 indicating threshold values set for the respective first fault types by using the plurality of inputted images 520. For example, the machine-learning-based model 510 may adjust the threshold values set for the respective first fault types by using a plurality of values indicating the relevance of the respective first fault types to the plurality of images 520. For example, the machinelearning-based model 510 may adjust the threshold values so that if the value representing the relevance of the A fault type to the image is equal to or larger than the threshold value set for the A fault type, the A fault type is determined to be associated with a solder paste with anomalies detected and so that if the value representing the relevance of the A fault type to the image is smaller than the threshold value set for the A fault type, the A fault type is determined not to be associated with a solder paste with anomalies detected.

For example, the machine-learning-based model 510 may receive an image classified as an A fault type, and calculate values indicating relevance of the inputted image to the A fault type and the B fault type as 0.7 and 0.5, respectively. In this case, the threshold value set for the A fault type might have been 0.8, and the threshold value set for the B fault type may be 0.4. In this case, as for the A fault type, the value 0.7 indicating the relevance of the inputted image to the A fault type is smaller than the threshold value 0.8 set for the A fault type. Therefore, the machine-learning-based model 510 may determine that the threshold value for the A fault type is incorrectly set, and may adjust the threshold value for the A fault type to become equal to or smaller than 0.7. In addition, as for the B fault type, the value 0.5 representing the relevance of the inputted image to the B fault type is larger than the threshold value 0.4 set for the B fault type. Therefore, the machine-learning-based model 510 may determine that the threshold value for the B fault type is incorrectly set, and may adjust the threshold value for the B fault type to exceed 0.5.

Through such a process, the teaching of the machine-learning-based model 510 may be performed to derive the threshold value information 550 indicating the threshold values set for the respective first fault types.

Figure 6:
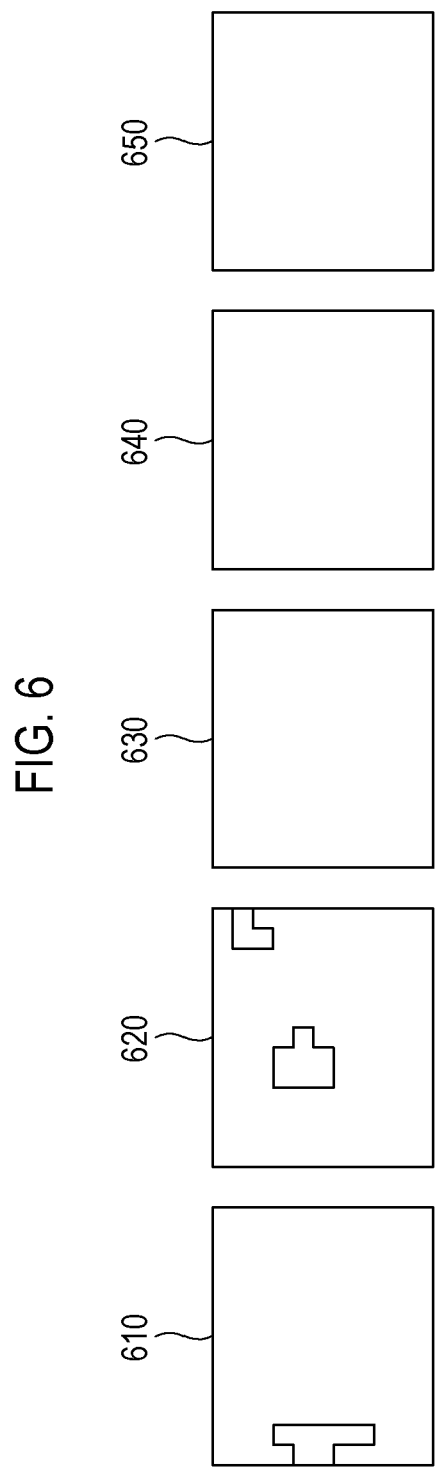
FIG. 6 shows a plurality of images generated in the machine-learning-based model according to various embodiments of the present disclosure.

FIG. 6 shows a plurality of images generated in the machine-learning-based model according to various embodiments of the present disclosure.

In one embodiment, the machine-learning-based model may generate a plurality of images having the same number as the number of the plurality of first fault types of the screen printer. Referring to FIG. 6, if the plurality of first fault types is five, the machine-learning-based model may generate five images. The five images generated in the machine-learning-based model may correspond to the plurality of first fault types, respectively. For example, a first image 610 may correspond to an A fault type, a second image 620 may correspond to a B fault type, a third image 630 may correspond to a C fault type, a fourth image 640 may correspond to a D fault type, and a fifth image 650 may correspond to an E fault type.

Each of the first image 610 to the fifth image 650 may indicate a region associated with the corresponding fault type. For example, the first image 610 may indicate a region associated with the A fault type, the second image 620 may indicate a region associated with the B fault type, the third image 630 may indicate a region associated with the C fault type, the fourth image 640 may indicate a region associated with the D fault type, and the fifth image 650 may indicate a region associated with the E fault type. In this regard, the region associated with the fault type may indicate a region on the substrate where an anomaly occurs due to the fault of the screen printer according to the fault type. In other words, the portion indicated in white in the first image 610 may indicate a region on the substrate where an anomaly occurs due to the fault of the screen printer according to the A fault type. Similarly, the portion indicated in white in the second image 620 may indicate a region on the substrate where an anomaly occurs due to the fault of the screen printer according to the B fault type. In addition, if the faults according to the C fault type through the E fault type do not occur in the screen printer, no fault occurs on the substrate due to such a fault. Therefore, like the third image 630 through the fifth image 650, all the images may be indicated in black. However, this is merely for the purpose of explanation. The present disclosure is not limited thereto. The area where an anomaly occurs due to a fault may be indicated in a color other than white in an image, and the region where an anomaly does not occur may also be indicated in a color other than black in an image.

Figure 7:
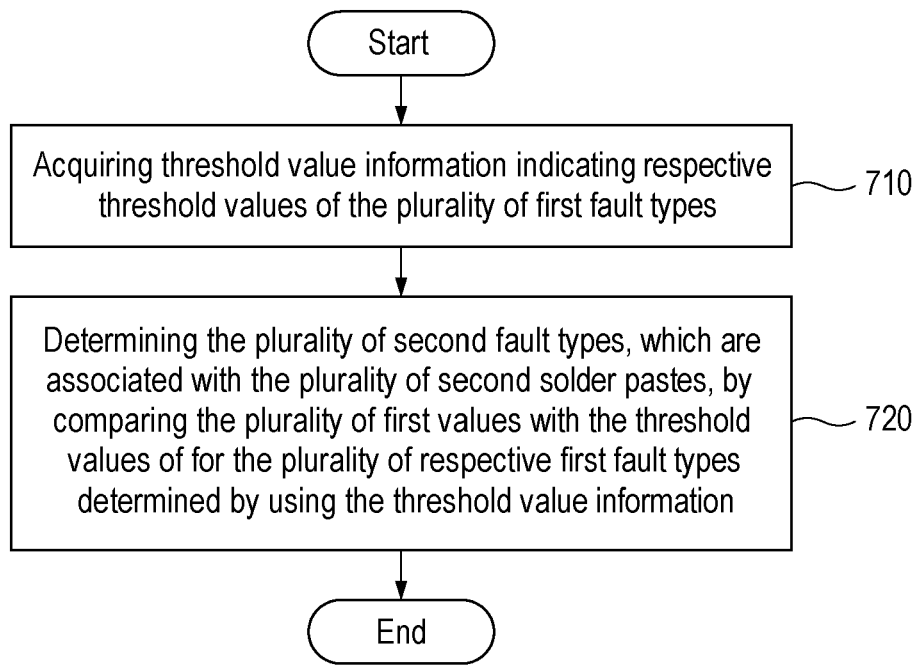
FIG. 7 is a flowchart of a method of determining a plurality of second fault types associated with a plurality of second solder pastes with anomalies detected according to various embodiments of the present disclosure.

FIG. 7 is a flowchart of a method of determining a plurality of second fault types associated with a plurality of second solder pastes with anomalies detected according to various embodiments of the present disclosure.

In step 710, the processor 130 of the substrate inspection apparatus 100 may acquire, from the machine-learning-based model, threshold value information indicating threshold values of the respective first fault types. As described with reference to FIG. 5, the machine-learning-based model may perform learning the threshold value information by adjusting the threshold values set for the respective first fault types by using a plurality of values indicating the relevance of the respective first fault types to the plurality of images. The processor 130 may acquire the threshold value information learned in the machine-learning-based model.

In step 720, the processor 130 may determine a plurality of second fault types, which are associated with the plurality of second solder pastes, by comparing the plurality of first values with the threshold values of the respective first fault types determined by using the threshold value information acquired from the machine-learning-based model with the plurality of first values. For example, the processor 130 may determine a plurality of second values equal to or larger than the threshold value among the plurality of first values, and may determine a plurality of fault types corresponding to the plurality of second values as a plurality of second fault types associated with the plurality of second solder pastes.

For example, the plurality of first values may include value a1 corresponding to the A fault type, value a2 corresponding to the B fault type, value a3 corresponding to the C fault type, value a4 corresponding to the D fault type, and value a5 corresponding to the E fault type. The processor 130 may compare a1 with t1 which is a threshold value set for the A fault type, may compare a2 with t2 corresponding to the B fault type, may compare a3 with t3 corresponding to the C fault type, may compare a4 with t4 corresponding to the D fault type, and may compare a5 with t5 corresponding to the E fault type. If the plurality of second values equal to or larger than the threshold values is determined to be a1 and a4 as a result of the comparison, the processor 130 may determine the plurality of second fault types associated with the plurality of second solder pastes to be the A fault type and the D fault type.

In addition, the processor 130 may also determine a plurality of second fault types by using threshold values preset for the plurality of first fault types without using the threshold value information acquired from the machine-learning-based model. In this case, the threshold values preset for the plurality of first fault types may be adjusted based on the threshold value information acquired from the machine-learning-based model.

Figure 8:
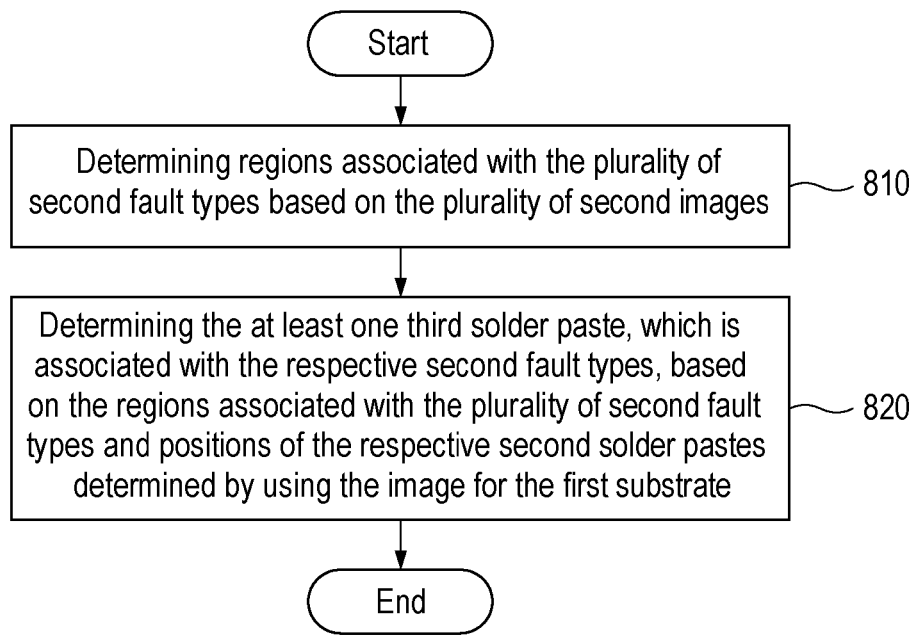
FIG. 8 is a flowchart of a method of determining at least one solder paste associated with each of a plurality of second fault types according to various embodiments of the present disclosure.

FIG. 8 is a flowchart of a method of determining at least one solder paste associated with a respective second fault types according to various embodiments of the present disclosure.

In step 810, the processor 130 of the substrate inspection apparatus 100 may determine regions associated with the plurality of second fault types based on a plurality of second images corresponding to the plurality of second fault types among the plurality of first images acquired from the machine-learning-based model. Referring to FIG. 9, the respective first images 910 and 920 may indicate a region 911 or 921 associated with one of the plurality of first fault types, i.e., a region on the substrate where an anomaly occurs due to the fault of the screen printer according to one of the plurality of first fault types. Each of the plurality of first images 930, 940 and 950 may be an image generated by the machine-learning-based model when there is no region associated with any one of the plurality of first fault types.

The processor 130 may determine a plurality of second images 910 and 920 corresponding to the plurality of second fault types associated with the plurality of second solder pastes with anomalies detected, and may confirm regions 911 and 921 indicated by the plurality of second images 910 and 920. In this regard, the regions 911 and 912 indicated by the plurality of second images 910 and 920 may denote regions associated with the plurality of second fault types, i.e., regions on the substrate where an anomaly occurs due to the fault of the screen printer according to the plurality of second fault types.

In step 820, the processor 130 may determine the at least one third solder paste, which is associated with the respective second fault types, based on the regions associated with the plurality of second fault types determined in step 810 and the positions of the respective second solder pastes determined by using the image about the first substrate. For example, the processor 130 may determine at least one solder paste 912 or 922 included in the regions associated with the plurality of second fault types, based on the respective positions of the plurality of second solder pastes. For example, referring to FIG. 9, the processor 130 may confirm at least one solder paste 912 included in the region 911 appearing in the first image 910 among the plurality of second solder pastes and at least one solder paste 922 included in the region 921 appearing in the second image 920 among the plurality of second solder pastes. The processor 130 may determine the at least one solder paste 912 included in the region 911 appearing in the first image 910 as at least one solder paste associated with the A fault type, and may determine the at least one solder paste 922 included in the region 921 appearing in the second image 920 as at least one solder paste associated with the B fault type.

As such, by determining at least one solder paste associated with the respective second fault types associated with the plurality of second solder pastes with anomalies detected, the position on the substrate associated with the fault of the screen printer may be quickly confirmed by using the position of the at least one solder paste thus determined.

While the foregoing methods have been described with respect to particular embodiments, these methods may also be implemented as computer-readable codes on a computer-readable recording medium. The computer-readable recoding medium includes any kind of data storage devices that can be read by a computer system. Examples of the computer-readable recording medium include ROM, RAM, CD-ROM, magnetic tape, floppy disk, optical data storage device and the like. Also, the computer-readable recoding medium can be distributed on computer systems which are connected through a network so that the computer-readable codes can be stored and executed in a distributed manner. Further, the functional programs, codes and code segments for implementing the foregoing embodiments can easily be inferred by programmers in the art to which the present disclosure pertains.

Although the technical features of the present disclosure have been described by the examples described in some embodiments and illustrated in the accompanying drawings, it should be noted that various substitutions, modifications, and changes can be made without departing from the scope of the present disclosure which can be understood by those skilled in the art to which the present disclosure pertains. In addition, it should be noted that that such substitutions, modifications and changes are intended to fall within the scope of the appended claims.

What is claimed is:

1. A substrate inspection apparatus, comprising:
   a memory configured to store a machine-learning-based model which has been trained to:
      derive a plurality of values indicating relevance of respective first fault types of a screen printer to an image indicating a plurality of solder pastes with anomalies detected; and
      generate a plurality of images indicating regions associated with one of a plurality of first fault types by using the image indicating the plurality of solder pastes with anomalies detected; and
   a processor electrically connected to the memory,
   wherein the processor is configured to:
      when anomalies of a plurality of second solder pastes among a plurality of first solder pastes printed on a first substrate is detected based on an image about the first substrate, generate at least one image indicating the plurality of second solder pastes by using the image about the first substrate;
      apply the at least one image to the machine-learning-based model;
      acquire, from the machine-learning-based model, a plurality of first values indicating relevance of the respective first fault types to the at least one image and a plurality of first images indicating regions associated with one of the plurality of first fault types;
      determine a plurality of second fault types, which are associated with the plurality of second solder pastes, among the plurality of first fault types based on the plurality of first values; and
      determine at least one third solder paste, which is associated with the respective second fault types, among the plurality of second solder pastes based on a plurality of second images, which correspond to the plurality of second fault types, among the plurality of first images.

2. The apparatus of claim 1, wherein the processor is configured to detect anomalies of the plurality of second solder pastes among the plurality of first solder pastes by using measurement information about the plurality of first solder pastes acquired by using the image about the first substrate.

3. The apparatus of claim 2, wherein the measurement information includes at least one of a volume, an area, a height, a shape, and a position of a solder paste.

4. The apparatus of claim 1, wherein the plurality of first fault types of the screen printer includes at least one of a fault of a squeeze blade, a squeeze blade fixing fault, a fault of a support, a fault of a table, a fault due to poor grid lock setting, a fault due to neglecting solder paste and poor kneading of solder paste, a fault due to shortage of solder paste, a fault due to poor stencil contact, a fault due to scratches on a stencil, and a fault due to bending of a substrate.

5. The apparatus of claim 1, wherein the machine-learning-based model is trained to:
    derive the plurality of values indicating the relevance of the respective first fault types to the image indicating the plurality of solder pastes with anomalies detected by using a plurality of images indicating the plurality of solder pastes with anomalies detected classified according to the plurality of first fault types; and
    generate the plurality of images indicating the regions associated with one of the plurality of first fault types.

6. The apparatus of claim 1, wherein the processor is configured to:
    acquire, from the machine-learning-based model, threshold value information indicating threshold values of the respective first fault types; and
    determine the plurality of second fault types, which are associated with the plurality of second solder pastes, by comparing the plurality of first values with the threshold values of the respective first fault types determined by using the threshold value information.

7. The apparatus of claim 6, wherein the machine-learning-based model is configured to learn the threshold value information by adjusting the threshold values set for the respective first fault types by using the plurality of values indicating the relevance of the respective first fault types to the image indicating the plurality of solder pastes with anomalies detected.

8. The apparatus of claim 1, wherein the regions indicated by the respective images generated by the machine-learning-based model are regions associated with different fault types.

9. The apparatus of claim 1, wherein the processor is configured to:
    determine regions associated with the plurality of second fault types based on the plurality of second images; and
    determine the at least one third solder paste, which is associated with the respective second fault types, based on the regions associated with the plurality of second fault types and positions of the respective second solder pastes determined by using the image about the first substrate.

10. The apparatus of claim 1, wherein the processor is configured to, after determining the plurality of second fault types, train the machine-learning-based model by using the at least one image.

11. A method of determining a fault type of a screen printer by a substrate inspection apparatus, comprising:
    when anomalies of a plurality of second solder pastes among a plurality of first solder pastes printed on a first substrate is detected based on an image about the first substrate, generating at least one image indicating the plurality of second solder pastes by using the image about the first substrate;
    applying the at least one image to a machine-learning-based model;
    acquiring, from the machine-learning-based model, a plurality of first values indicating relevance of respective first fault types to the at least one image and a plurality of first images indicating regions associated with one of a plurality of first fault types;
    determining a plurality of second fault types, which are associated with the plurality of second solder pastes, among the plurality of first fault types based on the plurality of first values; and
    determining at least one third solder paste, which is associated with the respective second fault types, among the plurality of second solder pastes based on a plurality of second images, which correspond to the plurality of second fault types, among the plurality of first images,
    wherein the machine-learning-based model is trained to:
        derive a plurality of values indicating relevance of the respective first fault types of the screen printer to an image indicating a plurality of solder pastes with anomalies detected, and
        generate a plurality of images indicating regions associated with one of the plurality of first fault types by using the image indicating the plurality of solder pastes with anomalies detected.

12. The method of claim 11, further comprising detecting anomalies of the plurality of second solder pastes among the plurality of first solder pastes by using measurement information about the plurality of first solder pastes acquired by using the image about the first substrate.

13. The method of claim 12, wherein the measurement information includes at least one of a volume, an area, a height, a shape, and a position of a solder paste.

14. The method of claim 11, wherein the plurality of first fault types of the screen printer includes at least one of a fault of a squeeze blade, a squeeze blade fixing fault, a fault of a support, a fault of a table, a fault due to poor grid lock setting, a fault due to neglecting solder paste and poor kneading of solder paste, a fault due to shortage of solder paste, a fault due to poor stencil contact, a fault due to scratches on a stencil, and a fault due to bending of a substrate.

15. The method of claim 11, wherein the machine-learning-based model is trained to:
    derive the plurality of values indicating the relevance of the respective first fault types to the image indicating the plurality of solder pastes with anomalies detected by using a plurality of images indicating the plurality of solder pastes with anomalies detected classified according to the plurality of first fault types; and
    generate the plurality of images indicating the regions associated with one of the plurality of first fault types.

16. The method of claim 11, wherein the step of determining the plurality of second fault types comprises:
    acquiring, from the machine-learning-based model, threshold value information indicating threshold values of the respective first fault types; and
    determining the plurality of second fault types, which are associated with the plurality of second solder pastes, by comparing the plurality of first values with the threshold values of the respective first fault types determined by using the threshold value information.

17. The method of claim 16, wherein the machine-learning-based model learns the threshold value information by adjusting the threshold values set for the respective first fault types by using the plurality of values indicating the relevance of the respective first fault types to the image indicating the plurality of solder pastes with anomalies detected.

18. The method of claim 11, wherein the regions indicated by the respective images generated by the machine-learning-based model are regions associated with different fault types.

19. The method of claim 11, wherein the step of determining at least one third solder paste comprises:
    determining regions associated with the plurality of second fault types based on the plurality of second images; and determining the at least one third solder paste, which is associated with the respective second fault types, based on the regions associated with the plurality of second fault types and positions of the respective second solder pastes determined by using the image about the first substrate.

20. The method of claim 11, further comprising, after determining the plurality of second fault types, training the machine-learning-based model by using the at least one image.

* * * * *